(12) United States Patent
Shen

(10) Patent No.: US 9,305,945 B2
(45) Date of Patent: Apr. 5, 2016

(54) TFT ARRAY SUBSTRATE, MANUFACTURING METHOD OF THE SAME AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Qiyu Shen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/610,008

(22) Filed: Jan. 30, 2015

(65) Prior Publication Data

US 2015/0137126 A1 May 21, 2015

Related U.S. Application Data

(62) Division of application No. 13/825,644, filed as application No. PCT/CN2012/087157 on Dec. 21, 2012, now Pat. No. 9,053,988.

(30) Foreign Application Priority Data

Jun. 4, 2012 (CN) .......................... 2012 1 0181978

(51) Int. Cl.
*H01L 27/12* (2006.01)
*H01L 29/417* (2006.01)
(Continued)

(52) U.S. Cl.
CPC ............ *H01L 27/1288* (2013.01); *H01L 21/77* (2013.01); *H01L 27/12* (2013.01);
(Continued)

(58) Field of Classification Search
CPC .............. H01L 27/124; H01L 27/1214; H01L 27/1255; H01L 27/14621; H01L 27/3262; H01L 21/28525; H01L 27/3248; H01L 29/786
See application file for complete search history.

(56) References Cited

U.S. PATENT DOCUMENTS 6,524,876 B1 2/2003 Baek et al.
6,894,760 B2 5/2005 Choi
(Continued)

FOREIGN PATENT DOCUMENTS

CN 101090136 A 12/2007
CN 101656232 A 2/2010
(Continued)

OTHER PUBLICATIONS

Extended European Search Report Appln. No. 12832780.6-1504/2731127 PCT/CN2012087157; Dated Feb. 15, 2013.
(Continued)

*Primary Examiner* — Evan Pert
*Assistant Examiner* — Gustavo Ramallo
(74) *Attorney, Agent, or Firm* — Ladas & Parry LLP

(57) ABSTRACT

According to embodiments of the invention, a TFT array substrate, a manufacturing method of the TFT array substrate and a display device are provided. The method comprises: depositing a metal film on a substrate, and forming a gate electrode and a gate line; forming a gate insulating layer and a passivation layer on the substrate; depositing a transparent conductive layer, a first source/drain metal layer and a first ohmic contact layer, and forming a drain electrode, a pixel electrode, a data line, and a first ohmic contact layer pattern provided on the drain electrode; and depositing a semiconductor layer, a second ohmic contact layer and a second source/drain metal layer, and forming a source electrode, a second ohmic contact layer pattern provided below the source electrode, and a semiconductor channel between the source electrode and the drain electrode.

6 Claims, 3 Drawing Sheets

(51) Int. Cl.
 *H01L 29/66* (2006.01)
 *H01L 29/786* (2006.01)
 *H01L 21/77* (2006.01)

(52) U.S. Cl.
 CPC .......... *H01L 27/124* (2013.01); *H01L 27/127* (2013.01); *H01L 27/1214* (2013.01); *H01L 27/1222* (2013.01); *H01L 29/41733* (2013.01); *H01L 29/66765* (2013.01); *H01L 29/786* (2013.01); *H01L 29/78618* (2013.01); *H01L 29/78669* (2013.01)

(56) References Cited

U.S. PATENT DOCUMENTS

| | | | |
|---|---|---|---|
| 6,960,484 B2 | 11/2005 | Yoo et al. | |
| 7,488,978 B2 | 2/2009 | Kim | |
| 8,178,374 B2 | 5/2012 | Min et al. | |
| 2006/0278877 A1* | 12/2006 | Kim et al. | 257/72 |
| 2007/0287236 A1* | 12/2007 | Kim | 438/158 |
| 2009/0148987 A1* | 6/2009 | Liao et al. | 438/158 |
| 2010/0165227 A1 | 7/2010 | Liu et al. | |
| 2012/0107982 A1* | 5/2012 | Song et al. | 438/30 |
| 2013/0092942 A1* | 4/2013 | Park et al. | 257/57 |
| 2014/0070219 A1 | 3/2014 | Shen | |

FOREIGN PATENT DOCUMENTS

| | | |
|---|---|---|
| CN | 102779783 A | 11/2012 |
| JP | 06-268220 A | 9/1994 |
| KR | 1020070053029 A | 5/2007 |
| KR | 20090022327 A | 3/2009 |
| KR | 001040137 B1 | 6/2011 |
| KR | 20110072869 A | 6/2011 |

OTHER PUBLICATIONS

International Search Report dated Mar. 20, 2013; PCT/CN2012/087157.
First Chinese Office Action dated Nov. 6, 2013; Appln. No. 201210181978.3.
Second Chinese Office Action dated Apr. 15, 2014; Appln. No. 201210181978.3.
Korean Examination Opinion dated Apr. 22, 2014; Appln. No. 10-2013-7008367.
International Preliminary Report on Patentability dated Dec. 9, 2014; PCT/CN2012/087157.
USPTO RR dated Feb. 28, 2014 in connection with U.S. Appl. No. 13/825,644.
USPTO NOA mailed Jul. 22, 2014 in connection with U.S. Appl. No. 13/825,644.
USPTO NOA mailed Sep. 8, 2014 in connection with U.S. Appl. No. 13/825,644.
USPTO NOA mailed Nov. 13, 2014 in connection with U.S. Appl. No. 13/825,644.

* cited by examiner

TFT ARRAY SUBSTRATE, MANUFACTURING METHOD OF THE SAME AND DISPLAY DEVICE

TECHNICAL FIELD

Embodiments of the invention relate to a TFT array substrate, a manufacturing method of the TFT array substrate and a display device.

BACKGROUND

Thin Film Field Effect Transistor Liquid Crystal Display (TFT-LCD) has advantages of small volume, low power consumption, free of radiation and the like, and occupies a dominant role in current panel display market. A TFT-LCD comprises an array substrate and a color filter substrate disposed opposite to each other, and a liquid crystal layer filled between the array substrate and the color filter substrate. A plurality of gate lines and a plurality of data lines are formed on the array substrate, and these gate lines and data lines intersect with each other to define a plurality of pixel units arranged in a matrix. Each of the pixel units comprises a thin film transistor and a pixel electrode.

Generally, the conventional array substrates are manufactured by using five patterning processes or four patterning processes. However, since a great number of mask plates are involved in the five patterning processes or four patterning processes, the manufacture process becomes complicated and the manufacture cost is high.

SUMMARY

According to an embodiment of the invention, a manufacturing method of a TFT array substrate is provided. The method comprises: depositing a metal film on a substrate, and forming a gate electrode and a gate line by using a first patterning process; forming a gate insulating layer and a passivation layer in this order on the substrate to cover the gate electrode and the gate line; depositing a transparent conductive layer, a first source/drain metal layer and a first ohmic contact layer in this order, and forming a drain electrode, a pixel electrode, a data line, and a first ohmic contact layer pattern provided on the drain electrode by using a second patterning process; and depositing a semiconductor layer, a second ohmic contact layer and a second source/drain metal layer in this order, and forming a source electrode, a second ohmic contact layer pattern provided below the source electrode, and a semiconductor channel between the source electrode and the drain electrode by a third patterning process.

According to another embodiment of the invention, an array substrate manufactured by using the aforementioned method is provided. The array substrate comprises a plurality of gate lines and a plurality of date lines formed on a substrate, the gate lines and the data lines intersect with each other to define a plurality of pixel units, and each of the pixel units comprises a TFT and a pixel electrode. The TFT comprises: a gate electrode formed on the substrate; a gate insulating layer and a passivation layer formed in this order on the substrate and covering the gate electrode; a drain electrode formed on the passivation layer; a first ohmic contact layer pattern formed on the drain electrode; a semiconductor layer formed on both of the first ohmic contact layer pattern and the passivation layer; a second ohmic contact layer pattern formed on the semiconductor layer and separated from the drain electrode and the first ohmic contact layer pattern; and a source electrode formed on the second ohmic contact layer pattern.

According to yet another embodiment of the invention, a display device is provided. The display device comprises the aforementioned array substrate.

According to embodiments of the invention, the array substrate can be obtained by using three patterning processes without changing the characteristics of the TFT. Therefore, the manufacturing process can be simplified and the manufacturing cost can be reduced.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention more apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

According to embodiments of the invention, an array substrate may be manufactured by the following steps: depositing a metal film on a substrate, and forming a gate electrode and a gate line by using a first patterning process; forming a gate insulating layer and a passivation layer in this order on the substrate to cover the gate electrode and the gate line; depositing a transparent conductive layer, a first source/drain metal layer and a first ohmic contact layer in this order, and forming a drain electrode, a pixel electrode, a data line and a first ohmic contact layer pattern provided on the drain electrode by using a second patterning process; depositing a semiconductor layer, a second ohmic contact layer and a second source/drain metal layer in this order, and forming a source electrode, a second ohmic contact layer pattern provided below the source electrode and a semiconductor channel between the source electrode and the drain electrode by a third patterning process.

Figure 1:
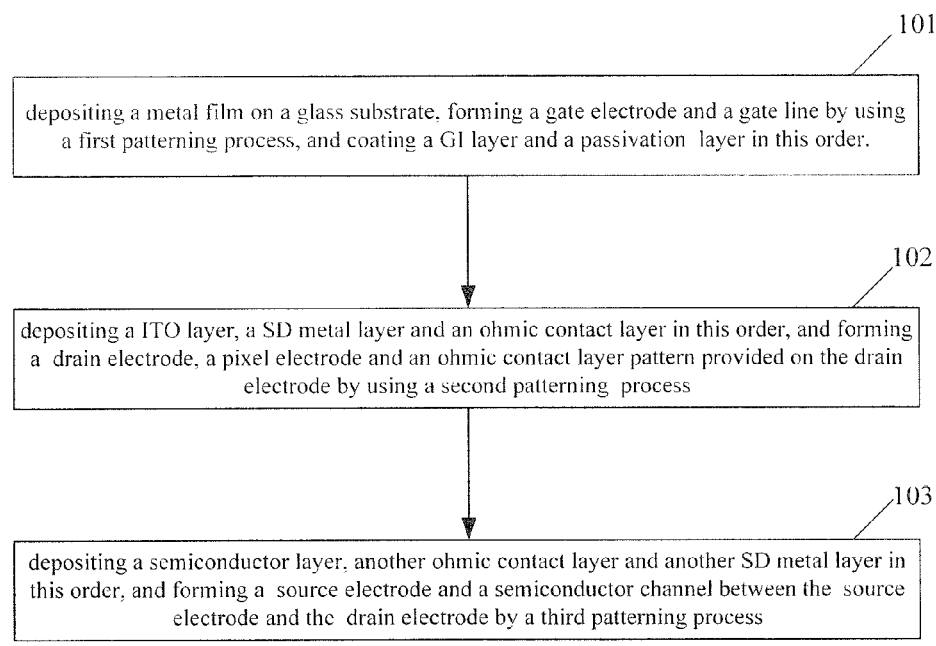
FIG. 1 is a flow chart illustrating an manufacturing method of an array substrate according to embodiments of the invention.

FIG. 1 is a flow chart illustrating a manufacturing method of an array substrate according to embodiments of the invention, and FIGS. 2-7 are schematic sectional views of the array substrate during the manufacturing process of the array substrate according to embodiments of the invention. With reference to FIGS. 1-7, the manufacturing method of the array substrate according to embodiments of the invention will be described in detail.

As shown in FIG. 1, the method comprises the steps as follows:

Step 101, depositing a metal film on a substrate, and forming a gate electrode and a gate line by using a first patterning process, and then forming a gate insulating layer and a passivation layer in this order.

For example, the substrate 1 is a glass substrate.

Figure 2:
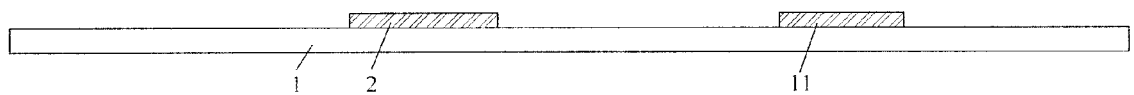
FIG. 2 is an illustrative cross-section view of the array substrate after a first patterning process in the manufacturing method of the array substrate according to embodiments of the invention.
Figure 3:
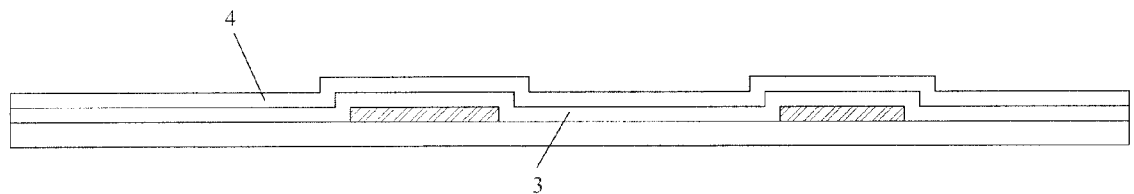
FIG. 3 is an illustrative cross-section view of the array substrate after forming a gate insulating layer and a passivation layer in the manufacturing method of the array substrate according to embodiments of the invention.

The metal film is deposited on the substrate 1, and the gate electrode 2 and the gate line (not shown) are formed by using the first patterning process, as shown in FIG. 2. Optionally, a common electrode line 11 may be simultaneously formed by using the first patterning process. The first patterning process is the same as the conventional patterning process, so detail descriptions thereof are omitted here.

Then, the gate insulating layer 3 and the passivation layer 4 are formed on the array substrate shown in FIG. 2. For example, the gate insulating layer 3 is formed by a coating method, and the gate insulating layer 3 is made of SiNx. For example, the passivation layer 4 is formed on the gate insulating layer 3 by coating method, and the passivation layer 4 is made of SiNx. It is not necessary to pattern the gate insulating layer 3 and the passivation layer 4.

Step 102, depositing a transparent conductive layer, a first source/drain metal layer and a first ohmic contact layer in this order, and forming a drain electrode, a pixel electrode, a data line, and a first ohmic contact layer pattern provided on the drain electrode by using a second patterning process;

Herein, the transparent conductive layer for example is made of indium tin oxide (ITO), and the first ohmic contact layer for example is made of n+ a-Si semiconductor layer.

Figure 4:
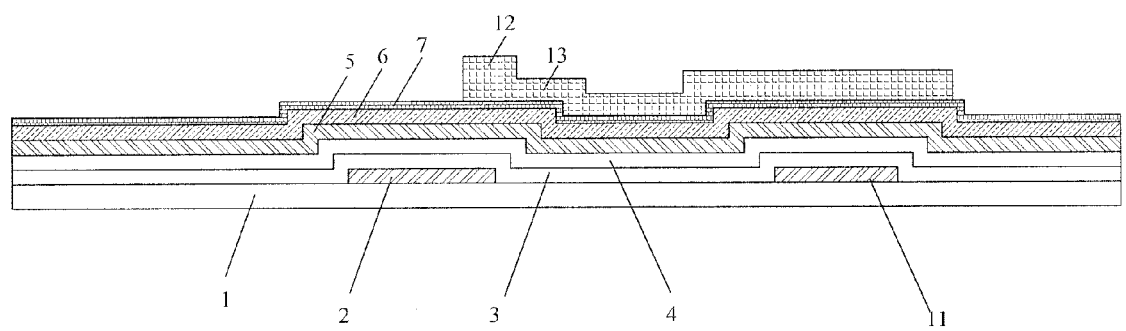
FIG. 4. is an illustrative cross-section view of the array substrate during a second patterning process in the manufacturing method of the array substrate according to embodiments of the invention.

As shown in FIG. 4, the transparent conductive layer 5, the first source/drain metal layer 6, the first ohmic contact layer 7 are deposited in this order, and a photoresist is coated on the first ohmic contact layer 7. The photoresist is exposed and developed to form a photoresist-free region, a first thickness photoresist region 12 and a second thickness photoresist region 13.

The first thickness photoresist region 12 corresponds to a region of the drain electrode region, the second thickness photoresist region 13 corresponds to a region of the pixel electrode, the other regions than the first thickness photoresist region 12 and the second thickness photoresist region 13 are the photoresist-free region. For example, the thickness of the first thickness photoresist region 12 corresponding to the drain electrode region is denoted as a, the thickness of the second thickness photoresist region 13 corresponding to the pixel electrode region is denoted as b. The thickness a and the thickness b satisfy the condition of: $a/3 \leq b \leq a/2$. The thickness a may be in the range of 2.1 μm~2.7 μm.

Figure 5:
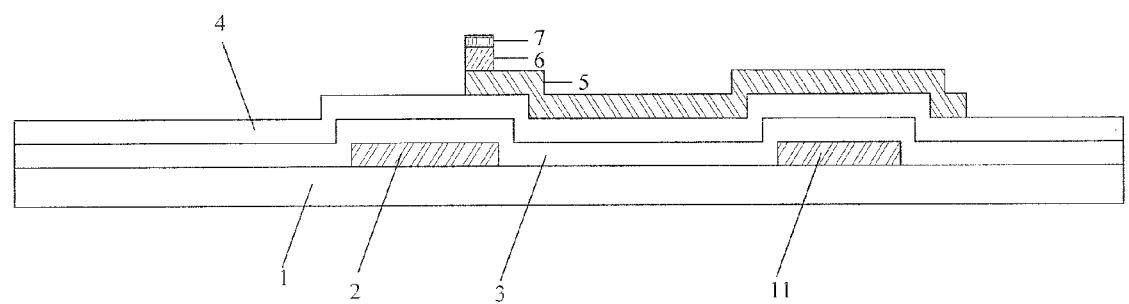
FIG. 5. is an illustrative cross-section view of the array substrate after the second patterning process in the manufacturing method of the array substrate according to embodiments of the invention.

A dry-etching process is performed to etch away the first ohmic contact layer 7 in the photoresist-free region; a wet-etching process is performed to etch away the first source/drain metal layer 6 in the photoresist-free region; and another wet-etching process is performed to etch away the transparent conductive layer 5 in the photoresist-free region. An ashing process is performed to remove the photoresist in the second thickness photoresist region 13 so as to expose a region covered by the second thickness photoresist region 13; a dry-etching process is performed to etch away the first ohmic contact layer 7 in this region; and a wet-etching process is performed to etch away the first source/drain metal layer 6 in this region. Due to $a/3 \leq b \leq a/2$, a portion of the photoresist 12 with thickness of a is remained after the ashing process is performed on the photoresist 13 with thickness of b. By removing the remaining portion of the photoresist 12, the drain electrode 6, the pixel electrode 5, the data line (not shown) and the first ohmic contact layer pattern 7 provided on the drain electrode 6 are obtained, as shown in FIG. 5.

Step 103, depositing a semiconductor layer, a second ohmic contact layer and a second source/drain metal layer in this order, and forming a source electrode, a semiconductor channel between the source electrode and the drain electrode and a second ohmic contact layer pattern provided below the source electrode by a third patterning process.

Herein, the semiconductor layer for example is an a-Si semiconductor layer, and the second ohmic contact layer for example is an n+ a-Si semiconductor layer.

Figure 6:
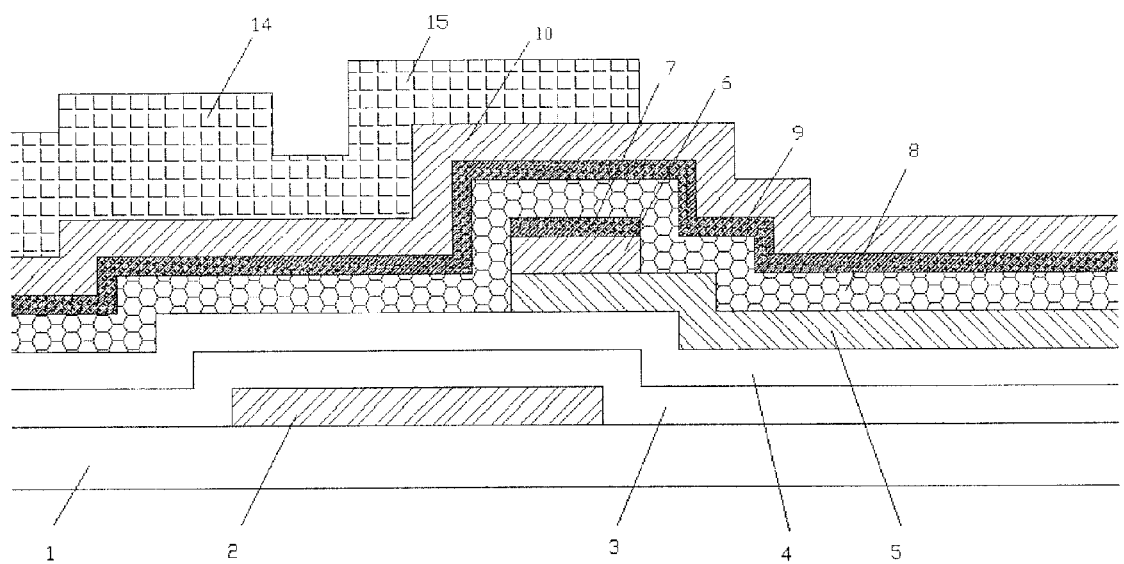
FIG. 6. is an illustrative cross-section view of the array substrate during a third patterning process in the manufacturing method of the array substrate according to embodiments of the invention.

As shown in FIG. 6, the semiconductor layer 8, the second ohmic contact layer 9 and the second source/drain metal layer 10 are deposited in this order, a photoresist is coated on the second source/drain metal layer 10, and the photoresist is exposed and developed so as to form a photoresist-free region, a third thickness photoresist region 14 and a fourth thickness photoresist region 15.

Figure 7:
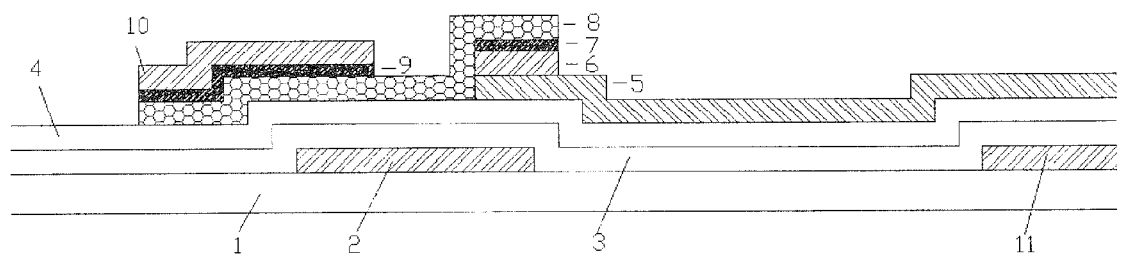
FIG. 7. is an illustrative cross-section view of the array substrate after the third patterning process in the manufacturing method of the array substrate according to embodiments of the invention.

The third thickness photoresist region 14 corresponds to a region of the source electrode, the fourth thickness photoresist region 15 corresponds to a region of the drain electrode and corresponds to a region between the source electrode and the drain electrode, the other regions than the third thickness photoresist region 14 and the fourth thickness photoresist regions 15 are the photoresist-free region. For example, the thickness of the third thickness photoresist 14 corresponding to the source electrode region is denoted as c, the thickness of the fourth thickness photoresist 15 corresponding to the drain electrode region is denoted as d. The thickness c and the thickness d satisfy the condition of: $c/3 \leq d \leq c/2$. The thickness c may be in the range of 2.1 μm~2.7 μm;

A wet-etching process is performed to etch away the second source/drain metal layer 10 in the photoresist-free region; a dry-etching process is performed to sequentially etch away the second ohmic contact layer 9 and the semiconductor layer 8 in the photoresist-free region, and at the same time, the layers covered by the photoresists in the regions 14 and 15 are remained. An ashing process is performed to remove the photoresist in the fourth thickness photoresist region 15 and expose a region covered by the fourth thickness photoresist 15. Then, the second source/drain metal layer 10 and the second ohmic contact layer 9 in the fourth thickness photoresist region 15 are sequentially etched away. Due to $a/3 \leq b \leq a/2$, a portion of the photoresist 14 with thickness of a is remained after the ashing process is performed on the photoresist 15 with thickness of d. By removing the remaining portion of the photoresist 14, the source electrode, the semiconductor channel between the source electrode and the drain electrode, and the second ohmic contact layer pattern provided under the source electrode are obtained, as shown in FIG. 7. In FIG. 7, reference number 10 denotes the source electrode, reference number 6 denotes the drain electrode, reference number 9 denotes the second ohmic contact layer pattern, reference number 7 denotes the first ohmic contact layer pattern, reference number 8 denotes the semiconductor layer, reference numbers 9,8,7 constitute the semiconductor channel between the source electrode and the drain electrode. It can be seen from FIG. 7 that the respective layers of the semiconductor channel are not provided in a same plane, they are provided in different layers in the vertical direction.

The embodiments of the invention further provide an array substrate which is manufactured by using the aforementioned method.

The array substrate comprises a plurality of gate lines and a plurality of data lines, both of which are formed on a substrate, these gate lines and data lines intersect with each other to define a plurality of pixel units arranged in a matrix form. Each of the pixel units comprises a thin film transistor and a pixel electrode.

Referring to FIG. 7, the TFT comprises: a gate electrode 2 formed on the substrate 1; a gate insulating layer 3 and a passivation layer 4 formed on the substrate 1 in this order and covering the gate electrode 2; a drain electrode 6 formed on the passivation layer 4; a first ohmic contact layer pattern 7 formed on the drain electrode 6; a semiconductor layer 8 formed on the first ohmic contact layer pattern 7 and the passivation layer 4; a second ohmic contact layer pattern 9 formed on the semiconductor layer 8 and separated from the drain electrode 6 and the first ohmic contact layer pattern 7; and a source electrode 10 formed on the second ohmic contact layer pattern 9.

Referring to FIG. 7, the semiconductor channel of the TFT comprises the first ohmic contact layer pattern 7 provided on the drain electrode 6, the second ohmic contact layer pattern 9 provided under the source electrode 10, and the semiconductor layer 8 provided between the first ohmic contact layer pattern 7 and the second ohmic contact layer pattern 9. For example, the first ohmic contact layer pattern 7 and the second ohmic contact layer pattern 9 may be formed of n+ a-Si, and the semiconductor layer 8 may be formed of a-Si. As shown in FIG. 7, the respective layers of the semiconductor channel of the TFT are not provided in a same plane, they are provided in different layers in the vertical direction.

Referring to FIG. 7, a portion of the pixel electrode 5 is interposed between the drain electrode 6 and the passivation layer 4 so that the pixel electrodes 5 and the drain electrode 6 are electrically connected with each other.

The embodiments of invention further provide a display device which comprises the aforementioned array substrate.

What are described above is related to the illustrative embodiments of the invention only and not limitative to the scope of the invention; the scopes of the invention are defined by the accompanying claims.

The invention claimed is:

1. A TFT array substrate, comprising:
   a plurality of gate lines and a plurality of data lines formed on a substrate,
   wherein the gate lines and the data lines intersect with each other to define a plurality of pixel units, and each of the pixel units comprises a TFT and a pixel electrode, and wherein the TFT comprises:
   a gate electrode formed on the substrate;
   a gate insulating layer and a passivation layer formed in this order on the substrate and covering the gate electrode;
   a drain electrode formed on the passivation layer;
   a first ohmic contact layer pattern formed on the drain electrode;
   a semiconductor layer formed on both of the first ohmic contact layer pattern and the passivation layer;
   a second ohmic contact layer pattern formed on the semiconductor layer and separated from the drain electrode and the first ohmic contact layer pattern; and
   a source electrode formed on the second ohmic contact layer pattern.

2. The TFT array substrate according to claim 1, wherein a channel of the TFT comprises: the first ohmic contact layer pattern provided on the drain electrode, the second ohmic contact layer pattern provided below the source electrode, and the semiconductor layer between the first ohmic contact layer pattern and the second ohmic contact layer pattern.

3. The TFT array substrate according to claim 2, wherein respective layers of the channel of the TFT are not provided in a same plane, they are provided in different layers in the vertical direction.

4. The TFT array substrate according to claim 1, wherein each of the first ohmic contact layer pattern and the second ohmic contact layer pattern is formed of n+a-Si semiconductor layer, and the semiconductor layer is formed of a-Si semiconductor layer.

5. The TFT array substrate according to claim 1, wherein the pixel electrode is interposed between the drain electrode and the passivation layer so that the pixel electrode and the drain electrode are electrically connected with each other.

6. A display device comprising:
   a TFT array substrate that comprises a plurality of gate lines and a plurality of data lines formed on a substrate, wherein the gate lines and the data lines intersect with each other to define a plurality of pixel units, and each of the pixel units comprises a TFT and a pixel electrode, and wherein the TFT comprises:
   a gate electrode formed on the substrate;
   a gate insulating layer and a passivation layer formed in this order on the substrate and covering the gate electrode;
   a drain electrode formed on the passivation layer;
   a first ohmic contact layer pattern formed on the drain electrode;
   a semiconductor layer formed on both of the first ohmic contact layer pattern and the passivation layer;
   a second ohmic contact layer pattern formed on the semiconductor layer and separated from the drain electrode and the first ohmic contact layer pattern; and
   a source electrode formed on the second ohmic contact layer pattern.

* * * * *